(12) United States Patent
Krasnansky

(10) Patent No.: US 6,377,073 B1
(45) Date of Patent: Apr. 23, 2002

(54) STRUCTURE AND METHOD FOR REDUCTION OF POWER CONSUMPTION IN INTEGRATED CIRCUIT LOGIC

(75) Inventor: Keith Krasnansky, Germantown, MD (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/449,673

(22) Filed: Nov. 30, 1999

(51) Int. Cl.$^7$ .................................. H03K 19/0175
(52) U.S. Cl. .................. 326/82; 326/80; 326/59
(58) Field of Search ...................... 326/59, 60, 80, 326/81, 82, 83, 86

(56) References Cited

U.S. PATENT DOCUMENTS

| | | | | |
|---|---|---|---|---|
| 4,115,706 A | * | 9/1978 | Yamaguchi | 326/59 |
| 5,745,003 A | * | 4/1998 | Wakimoto et al. | 327/382 |
| 6,049,229 A | * | 4/2000 | Manohar et al. | 326/60 |

* cited by examiner

Primary Examiner—Michael Tokar
Assistant Examiner—Don Phu Le
(74) Attorney, Agent, or Firm—Frederick J. Telecky, Jr.; Wade James Brady, III; Warren L. Franz

(57) ABSTRACT

A reduced power dissipation integrated circuit. Power dissipation within a CMOS circuit is reduced by substitution of multi-level buses with several thresholds for binary state buses with a single threshold. A significant portion of an IC's power dissipation is consumed by the act of charging and discharging data and address busses within the IC because theses busses possess the highest capacitances of any of the nodes within the part. The present invention uses a series of thresholds from a minimum voltage to a maximum voltage. Below the minimum threshold voltage Vref1, the logic state would be "0". Above the maximum threshold voltage Vrefn, the logic state would be "n". A series of defined thresholds, Vref1, Vref2, . . . Vrefn, between the minimum and maximum voltages define a series of logic states 0, 1, 2 . . . n+1 between 0 and n+1.

10 Claims, 1 Drawing Sheet

STRUCTURE AND METHOD FOR REDUCTION OF POWER CONSUMPTION IN INTEGRATED CIRCUIT LOGIC

BACKGROUND OF THE INVENTION

1. Field of the Invention

The present invention relates to integrated circuit power dissipation. More specifically, the present invention relates to a lower power dissipation bus structure within an integrated circuit or a circuit board.

2. Description of the Background Art

Integrated circuits operate by charging and discharging internal components in order to switch between logic states. The frequency at which an integrated circuit switches between logic states is referred to as its switching frequency. Each switching cycle dissipates power in charging and discharging components and in passing the power through busses to and from the logical components. The faster the switching frequency, the greater the power dissipation in a given period of time.

The dissipation of power generates heat. The quantity of heat generated in a given area of an integrated circuit is directly proportional to the density of the logic elements and circuitry on the integrated circuit chip. The heat generated should be removed from the chip to maintain the chip within its proper operating temperature. The rate of heat removal is proportional to its surface area, including any surface area of a heat sink attached to the chip and the rate of air flow over the chip. A densely packed chip with a high switching frequency must dissipate significantly more heat with a smaller surface area than a larger chip with a slower switching frequency and less dense packing.

The increase in switching frequencies and chip densities of current integrated circuit chips requires additional techniques for reducing power dissipation to maintain acceptable operational temperatures. Some integrated circuit chips have incorporated a reduction in operational voltage to compensate for increased power dissipation requirements. By decreasing the operational voltage of a chip, the quantity of power dissipated during logic level switching is reduced.

The technique of reducing the operational voltage to reduce power dissipation is approaching its physical limitations due to a variety of reasons, including the minimal necessary voltage for the logic elements. Current integrated circuits, such as DSP's, RISC processors and the like typically operate between 2 volts and 9 volts. Operating voltages of current integrated circuits are approaching 1.0 volt. The operational voltage of an integrated circuit cannot be reduced significantly below 0.9 volts otherwise differentiation of logic states will be lost due to noise margins associated with resistive losses, switching noise and thermal noise.

SUMMARY OF THE INVENTION

This present invention address a new method of reducing power dissipation within an integrated circuit. Power dissipation within a CMOS circuit is a result of either charging a node from a low voltage to a higher voltage or from discharging a node from a high voltage to a lower voltage. Typically, the lower voltage state is referred to as Vss and the higher voltage is referred to as Vdd. The two voltages are derived from two power supply voltages to the integrated circuit.

The present invention reduces the significant portion of the IC's power dissipation consumed by the act of charging and discharging data and address busses within the IC because theses busses possess the highest capacitances of any of the nodes within the part. The present invention provides a multi-level bus circuit, with a plurality of input voltages; a bus connected at a first end to said plurality of input voltages and assuming a bus voltage corresponding to a selected one of said input voltages; and a logic circuit for sensing said bus voltage and for producing a binary output corresponding to said sensed voltage.

Presently, a data or address bus consists of "n" parallel lines where each line switches between Vdd and Vss in order to transfer information. The information on each of these lines is represented by two unique states, where a state is defied by the voltage on the line with respect to predefined voltage thresholds. For example, most binary systems define a logic "0" to be any voltage below 0.8 V and a logic "1" to be any voltage above 2.0 V, thus a voltage difference of 1.2 V. The region between 0.8 V and 2.0 V is the logic threshold. Since there is one threshold, there are two logic states: "0" below the threshold and "1" above the threshold.

The present invention defines a series of n+1 logic states by setting a series of thresholds from a minimum voltage to a maximum voltage. Below the minimum threshold voltage Vref1, the logic state would be "0". Above the maximum threshold voltage Vrefn, the logic state would be "n". A series of defined thresholds, Vref1, Vref2, . . . Vrefn, between the minimum and maximum voltages define a series of logic states 0, 1, 2 . . . n+1 between 0 and n+1. A multi-level line is used to carry the voltage signal. A voltage on the line is detected to indicate the logic state of the line.

BRIEF DESCRIPTION OF THE DRAWINGS

For a better understanding of the nature of the present invention, reference is had to the following figures and detailed description, wherein like elements are accorded like reference numerals, and wherein.

DETAILED DESCRIPTION OF PREFERRED EXEMPLARY EMBODIMENTS

Figure 1:
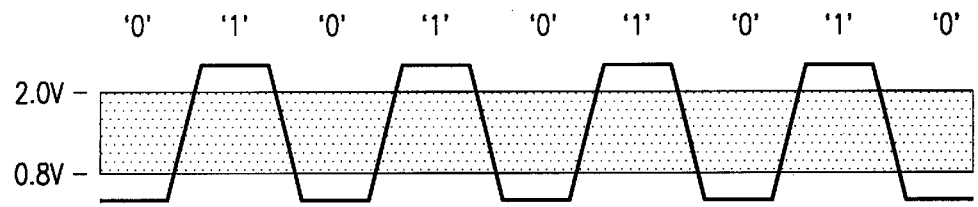
FIG. 1 is a signal plot diagram illustrating the change of voltage corresponding to the change of logic state in a two state line.

As illustrated in FIG. 1, a single signal line with a single threshold can have two states "0" and "1". The conductor line is either charged above 2.0 v or discharged below 0.8 v. When the line is above 2.0 v the logic state of the line is 1. When the voltage on the line is below 0.8 v, the logic state of the line is 0. The line dissipates power in watts based upon the voltage change of 1.6 v in charging or discharging between these two logic states (ie. 0.6 v to 2.2 v). A single line can therefore transmit two logic values. In order to transmit a logic representation of four separate values in binary code (00, 01, 10, 11), two single threshold lines are needed. These two lines, by switching logic states between "0" and "1" can represent binary numbers 00, 01, 10 and 11. Table I illustrates the transition between all possible logic states, and the voltage change relative to the power dissipation for each transition, given a pair of two state conductor lines as illustrated in FIG. 1:

TABLE I

| Logic state change | Power dissipation |
|---|---|
| 00 → 01 | 1.6 v |
| 00 → 10 | 1.6 v |
| 00 → 11 | 4.8 v |
| 01 → 00 | 1.6 v |
| 01 → 10 | 4.8 v |
| 01 → 11 | 1.6 v |
| 10 → 00 | 1.6 v |
| 10 → 01 | 4.8 v |
| 10 → 11 | 1.6 v |
| 11 → 00 | 4.8 v |
| 11 → 01 | 1.6 v |
| 11 → 10 | 1.6 v |
| Total: | 32 v |
| Average: | 2.7 v |

Figure 2:
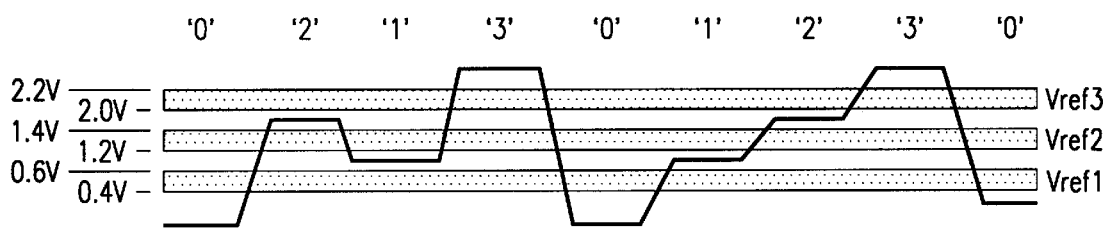
FIG. 2 is a signal plot diagram illustrating the change of voltage corresponding to the change of logic states in a multi-level line have three thresholds.

As illustrated in FIG. 2, a single line with three thresholds can have four states "0", "1", "2", and "3". By replacing the two lines with a single multi threshold line of the present invention, binary values 00, 01, 10 and 11 can be transmitted as thresholds 0, 1, 2, 3 respectively, by a single line.

The present invention replaces a group of m lines of a bus with a single line that switches between n voltage thresholds to define n+1 unique states. If the multi state lines has three thresholds (n) than each pair of binary state lines can be replaced with a single multi-level line. In the illustrative example, m=2 and n=3. In order to replace two binary state lines, the multi-level buss requires 3 thresholds. In order to replace three binary state lines, a single multi-level bus requires seven thresholds (m=3, n=7). However, two multi-level lines with three thresholds each can replace four binary state lines (m=4, 2(n=3)).

Another advantage illustrated by FIG. 2 is that many state changes may occur with minimal changes in voltage levels. In the binary state line, FIG. 1, each state change requires a power dissipation associated with a voltage change of at least 1.6 V. In the multi-level line of the present invention, FIG. 2, a change between states requires 0.7 volts per state. In the exemplary embodiment, changing between states "0" and "3" consumes the most power because of the voltage change of 2.1 V. Changing between adjacent states requires 0.7 V. Changing between two non-adjacent states (eg. 1 to 3 or 0 to 2) requires 1.4 volts. Table II illustrates the voltage change for each potential state change of an exemplary embodiment of the present invention:

TABLE II

| State Change | Voltage Change |
|---|---|
| 0 → 1 | 0.7 |
| 0 → 2 | 1.4 |
| 0 → 3 | 2.1 |
| 1 → 0 | 0.7 |
| 1 → 2 | 0.7 |
| 1 → 3 | 1.4 |
| 2 → 0 | 1.4 |
| 2 → 1 | 0.7 |
| 2 → 3 | 0.7 |
| 3 → 0 | 2.1 |

TABLE II-continued

| State Change | Voltage Change |
|---|---|
| 3 → 1 | 1.4 |
| 3 → 2 | 0.7 |
| Total | 14 |
| Average | 1.17 |

Statistically, the average voltage change per state change is 1.17 v. This reduced average voltage change per state change results in a reduction in power dissipation.

One means of implementation of this technique is to create x global reference voltages (Vref1 to Vrefx) and x+1 global state voltages (Vstate0 through Vstate3) that are stable across the entire device. In an exemplary embodiment of the present invention, the reference voltages and state voltages are maintained stable because they stay fixed and are not used to source or sink current.

Figure 3:
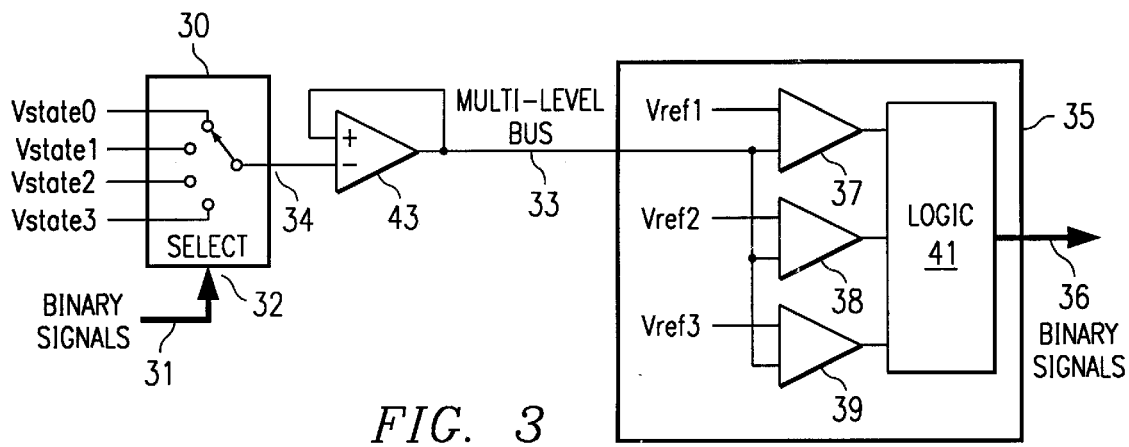
FIG. 3 is a block circuit diagram illustrating a multi-level bus of the present invention with a unity gain buffer.

As illustrated in FIG. 3, when a binary circuit 31 within the IC needs to drive the multi-level bus 33, the binary output 32 is used to determine which state voltage, (for example Vstate0 through Vstate3 in a four state multi-level bus), is applied to the multi-level line 34. Binary output 32 is applied as a select to logic 30 to select the input Vstate voltage to be applied to line 34.

At the receiving end 35 of the multi-level bus 33, the global reference voltages (Vref1 through Vref3 in the exemplary embodiment), are used to decode the state voltage back to the binary value 36. The multi level bus voltage is presented to a set of comparators 37, 38 and 39. The output of the comparators 37, 38 and 39 is dependant on the voltage of multi-level bus 33. The comparator output is applied to logic 41 to decode and produce a binary output 36.

In order to maintain the stability (minimize noise) of the reference and state voltages across the device, in one exemplary implementation the reference and state voltages are not used to drive any data lines. These voltages in the exemplary embodiment are isolated for use for reference. An alternative embodiment of the present invention uses a unity gain buffer 43 to drive the multi level bus 33 to achieve stability. Unity gain buffer 43 isolates the multilevel bus from variations in Vstate voltages which may occur. The buffers drive an intermediate voltage between Vdd and Vss and inherently consume more power than drivers that switch between two voltage rails. The present invention utilizes a buffer 43 that drives the Vstate voltages while dissipating the same amount of power as a CMOS level driver.

Figure 4:
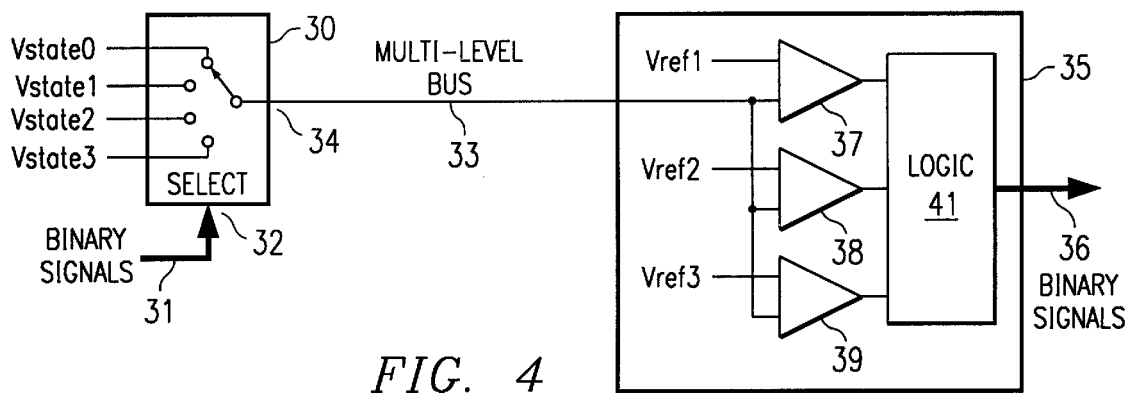
FIG. 4 is a block circuit diagram illustrating a multi-level bus of the present invention with external reference and state voltage generation.

In another embodiment of the present invention, FIG. 4, the Vref and Vstate voltages are generated by an external power supply device in which the Vstate voltages are treated as extra power rails into the device with the appropriate current sink and source capabilities. The embodiment of FIG. 4 does not utilize a unity buffer.

Providing a multilevel bus requires that the bus line voltage be maintained within narrow tolerances. For example, in the bus illustrated in FIG. 2, in order represent logic state 1, the line voltage will be between 0.6 v and 1.2 v (exclusive). This gives a voltage tolerance range of 0.5 v. Therefore, the noise margin between states is narrow and control of bus voltage becomes important.

Because many varying and different embodiments may be made within the scope of the inventive concept herein taught, and because many modifications may be made in the embodiments herein detailed in accordance with the descriptive requirements of the law, it is to be understood that the details herein are to be interpreted as illustrative and not in a limiting sense.

What is claimed is:

1. A multi-level bus circuit, comprising:
   a plurality of input voltages;
   a bus operatively selectively connected at a first end to said plurality of input voltages and assuming a bus voltage corresponding to a selected one of said input voltages; and
   a logic circuit connected to a second end of said bus, sensing said bus voltage and producing a binary output corresponding to said sensed voltage, wherein said logic circuit includes:
      a plurality of reference voltages; and
      a plurality of comparators operatively connected to said second end of said bus and respective ones of said reference voltages.

2. A multi-level bus according to claim 1, further comprising:
   a buffer between said input voltages and said reference voltages.

3. A bus, comprising:
   a conductor having a high threshold above a first voltage and a low threshold below a second voltage, and having at least one intermediate threshold between said first and second voltages;
   a plurality of input state voltages operatively selectively connected to a first end of said bus; and
   a logic circuit connected to a second end of said bus, for sensing bus voltage and for producing a binary output corresponding to said sensed voltage, wherein said logic circuit includes:
      a plurality of reference voltages; and
      a plurality of comparators operatively connected to said second end of said bus and respective ones of said reference voltages.

4. A bus according to claim 3, further comprising:
   a buffer between said input voltages and said reference voltages.

5. An integrated circuit chip with reduced power dissipation, comprising:
   a circuit,
   a plurality of input voltages to said chip, including:
      isolated state voltages inputs; and
      isolated reference voltage inputs;
   a bus operatively selectively connected at a first end to said state voltages for assuming a bus voltage corresponding to a selected one of said state voltages; and
   a logic circuit operatively connected to a second end of said bus for sensing said bus voltage, for comparing said bus voltage with said reference voltages and for producing a binary output corresponding to said comparison.

6. An integrated circuit according to claim 5, wherein said logic circuit includes:
   a plurality of comparators operatively connected to said second end of said bus and respective ones of said reference voltages.

7. An integrated circuit according to claim 6, said bus further comprising:
   a buffer between said input voltages and said reference voltages.

8. A DSP with reduced power dissipation, comprising:
   a circuit,
   a plurality of input voltages to said DSP, including:
      isolated state voltages inputs; and
      isolated reference voltage inputs;
   a bus operatively selectively connected at a first end to said state voltages for assuming a bus voltage corresponding to a selected one of said state voltages; and
   a logic circuit operatively connected to a second end of said bus for sensing said bus voltage, for comparing said bus voltage with said reference voltages and for producing a binary output corresponding to said comparison.

9. A DSP according to claim 8, wherein said logic circuit includes:
   a plurality of comparators operatively connected to said second end of said bus and respective ones of said reference voltages.

10. A DSP according to claim 9, said bus further comprising:
   a buffer between said input voltages and said reference voltages.

* * * * *